(12) United States Patent
Li et al.

(10) Patent No.: US 9,171,864 B2
(45) Date of Patent: Oct. 27, 2015

(54) DISPLAY SUBSTRATE AND METHOD OF MANUFACTURING THE SAME

(71) Applicant: Samsung Display Co., LTD., Yongin, Gyeonggi-Do (KR)

(72) Inventors: Xinxing Li, Suwon-si (KR); Do-Hyun Kim, Seongnam-si (KR); Chan-Woo Yang, Siheung-si (KR); Jeong-Ju Park, Seoul (KR); Jun-Hyun Park, Suwon-si (KR); Xun Zhu, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/249,199

(22) Filed: Apr. 9, 2014

(65) Prior Publication Data

US 2015/0155309 A1 Jun. 4, 2015

(30) Foreign Application Priority Data

Dec. 4, 2013 (KR) .................. 10-2013-0149686

(51) Int. Cl.
*H01L 21/84* (2006.01)
*H01L 27/12* (2006.01)

(52) U.S. Cl.
CPC ........ *H01L 27/1225* (2013.01); *H01L 27/1259* (2013.01)

(58) Field of Classification Search
CPC .................................. H01L 27/1259
USPC ........................................ 438/160
See application file for complete search history.

(56) References Cited

U.S. PATENT DOCUMENTS

| 6,972,819 B2 | 12/2005 | Lee et al. |
| 2002/0168789 A1* | 11/2002 | Wong .............................. 438/30 |
| 2011/0127532 A1 | 6/2011 | Ahn |
| 2015/0021592 A1* | 1/2015 | Seo et al. ......................... 257/43 |

FOREIGN PATENT DOCUMENTS

| JP | 2007-258551 | 10/2007 |
| KR | 1020010003400 A | 1/2001 |
| KR | 1020050094135 A | 9/2005 |
| KR | 1020080022829 A | 3/2008 |
| KR | 1020120002684 A | 1/2012 |

* cited by examiner

*Primary Examiner* — Daniel Whalen
(74) *Attorney, Agent, or Firm* — Innovation Counsel LLP (57) ABSTRACT

A display substrate includes a gate metal pattern including a gate line disposed on a base substrate and a gate electrode electrically connected with the gate line, an active pattern entirely overlapped with the gate metal pattern and comprising an oxide semiconductor and a data metal pattern disposed on the active pattern and including a data line, a source electrode electrically connected with the gate line and a drain electrode spaced apart from the source electrode. The active pattern has an overlapped region in which the active pattern is overlapped with the source electrode and the drain electrode and an exposed region in which the active pattern is not overlapped with the source electrode and the drain electrode. The thickness of the overlapping region and a thickness of the exposing region are same.

12 Claims, 11 Drawing Sheets

FIG. 17

DISPLAY SUBSTRATE AND METHOD OF MANUFACTURING THE SAME

This application claims priority to Korean Patent Application No. 10-2013-0149686, filed on Dec. 4, 2013, and all the benefits accruing therefrom under 35 U.S.C. §119, the contents of which are incorporated by reference herein in their entireties.

FIELD

A display substrate and a method of manufacturing the display substrate are provided. More particularly, a display substrate including an oxide semiconductor, and a method of manufacturing the display substrate are provided.

DESCRIPTION OF THE RELATED ART

Generally, a thin film transistor for driving a pixel unit in a display device includes a gate electrode, a source electrode, a drain electrode, and a channel layer forming a channel between the source electrode and the drain electrode. The channel layer includes a semiconductor layer including amorphous silicon, polycrystalline silicon, oxide semiconductor, or the like.

Amorphous silicon has a relatively low electron mobility, which may be about 1 to about 10 $cm^2/V \cdot s$, so that a thin film transistor including amorphous silicon has relatively low driving characteristics. In contrast, polycrystalline silicon has a relatively high electron mobility, which may be about 10 to about hundreds $cm^2/V \cdot s$. However, a crystallization process is required for forming polycrystalline silicon. Thus, it is difficult to form a uniform polycrystalline silicon layer on a large-sized substrate, and resulting manufacturing costs are high. Oxide semiconductors may be formed through a low-temperature process, may be easily large-scaled, and has a high electron mobility. Thus, research is actively being conducted on thin film transistors which include an oxide semiconductor.

In a process of a manufacturing a display substrate including oxide semiconductor, when a data metal pattern disposed on an oxide semiconductor pattern is etched, the oxide semiconductor pattern is partially etched. Accordingly, a channel portion of a thin film transistor may be thin, and thus image quality of a display apparatus may be degraded.

SUMMARY

A display substrate having an improved reliability is provided.

A method of manufacturing the display substrate is provided.

A display substrate includes a gate metal pattern including a gate line disposed on a base substrate and a gate electrode electrically connected with the gate line, an active pattern entirely overlapped with the gate metal pattern and including an oxide semiconductor and a data metal pattern disposed on the active pattern and including a data line, a source electrode electrically connected with the gate line and a drain electrode spaced apart from the source electrode. The active pattern has an overlapped region in which the active pattern is overlapped with the source electrode and the drain electrode and an exposed region in which the active pattern is not overlapped with the source electrode and the drain electrode. A thickness of the overlapped region is the same as a thickness of the exposed region.

The active pattern may include at least one selected from the group consisting of zinc oxide, zinc tin oxide, indium zinc oxide, indium oxide, titanium oxide, indium gallium zinc oxide and indium zinc tin oxide.

The active pattern may cover an entire portion of a lower surface of the data metal pattern.

The data metal pattern may include a metal layer and a lower barrier layer disposed under the metal layer and contacting the active pattern.

The metal layer may include copper.

The lower barrier layer may include at least one selected from the group consisting of indium zinc oxide, indium tin oxide, gallium zinc oxide and zinc aluminum oxide.

The data metal pattern may further include an upper barrier layer disposed on the metal layer.

In an example embodiment, the upper barrier layer may include at least one selected from the group consisting of indium zinc oxide, indium tin oxide, gallium zinc oxide and zinc aluminum oxide.

A method of manufacturing a display substrate includes forming sequentially a gate metal pattern, a gate insulation layer and an oxide semiconductor layer on a base substrate, forming a first photoresist layer on the oxide semiconductor layer, exposing the first photoresist layer to form a first photoresist pattern in which the first photoresist layer covers the base substrate except for a source electrode region and a drain electrode region, forming a source electrode and a drain electrode in the source electrode region and the drain electrode region respectively, forming a second photoresist layer on the source electrode and the drain electrode, exposing the second photoresist layer using back exposure through the base substrate to form a second photoresist pattern and etching the oxide semiconductor layer by using the second photoresist pattern as a etch stop layer to form an active pattern.

The forming a source electrode and a drain electrode may include depositing a data metal layer on the first photoresist pattern and removing the first photoresist pattern.

The first photoresist layer may include a negative type photoresist composition.

The first photoresist layer may include a positive type photoresist composition.

Removing the first photoresist pattern may include removing the data metal layer formed on the first photoresist pattern.

The data metal layer may be deposited by a sputtering process.

The oxide semiconductor layer may include at least one selected from the group consisting of zinc oxide, zinc tin oxide, indium zinc oxide, indium oxide, titanium oxide, indium gallium zinc oxide and indium zinc tin oxide.

The source electrode and the drain electrode may include a metal layer and a lower barrier layer disposed under the metal layer and contacting the active pattern.

The metal layer may include copper.

The lower barrier layer may include at least one selected from the group consisting of indium zinc oxide, indium tin oxide, gallium zinc oxide and zinc aluminum oxide.

The data metal pattern may further include an upper barrier layer disposed on the metal layer.

The upper barrier layer may include at least one selected from the group consisting of indium zinc oxide, indium tin oxide, gallium zinc oxide and zinc aluminum oxide.

Accordingly, an active pattern is not etched. Thus, a thickness of an overlapped region of the active pattern and a thickness of an exposed region of the active pattern AP may be same.

In addition, a thickness of the active pattern is uniformly formed, so that a characteristic of a thin film transistor may be improved. Thus, a quality of a display apparatus may be improved.

BRIEF DESCRIPTION OF THE DRAWINGS

The above and other aspects, advantages and features of this disclosure will become more apparent by describing in further detail example embodiments thereof in conjunction with the accompanying drawings, in which.

DETAILED DESCRIPTION

Hereinafter, example embodiments will be explained in detail with reference to the accompanying drawings.

Figure 1:
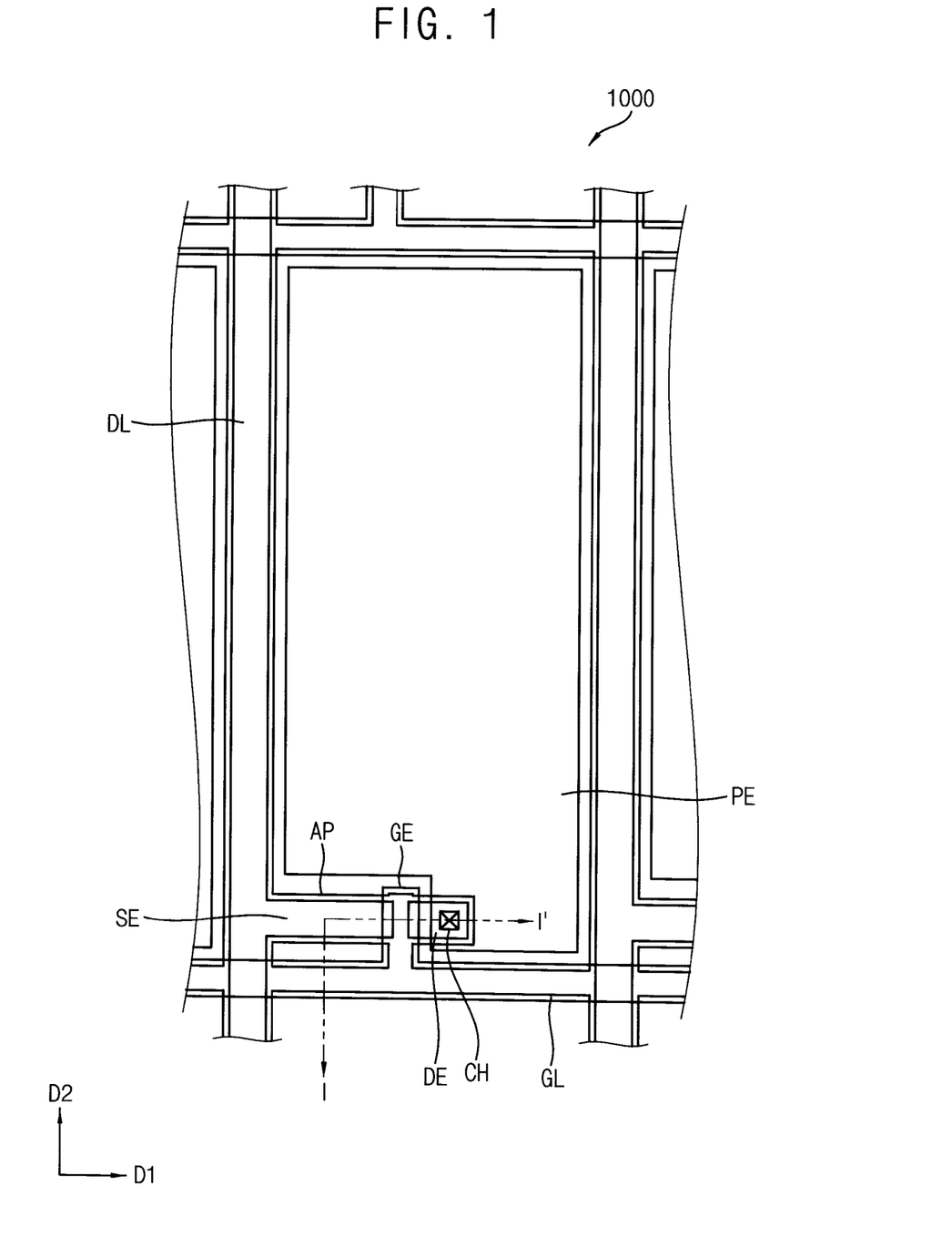
FIG. 1 is a plan view illustrating a display substrate according to an example embodiment.
Figure 2:
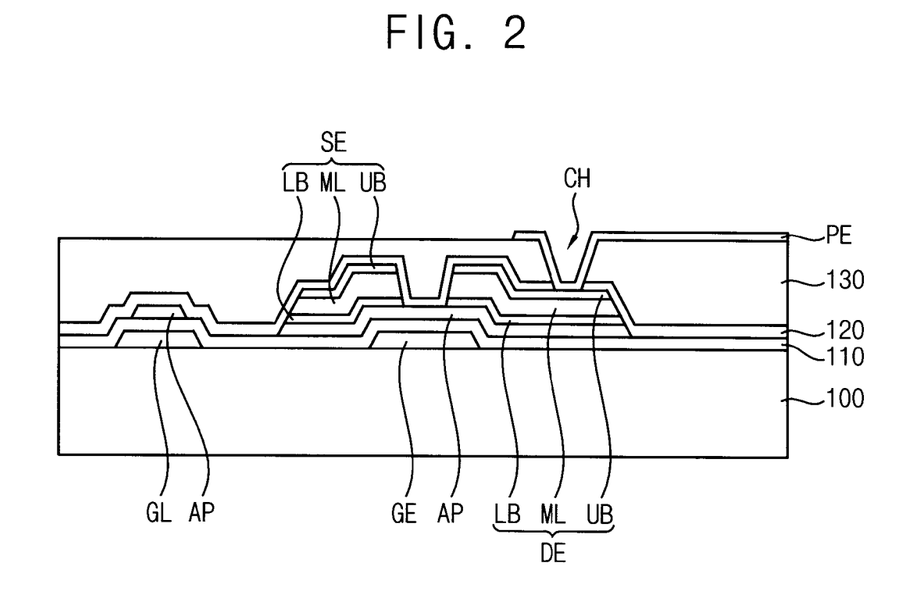
FIG. 2 is a cross-sectional view taken along the line I-I' of FIG. 1.

FIG. 1 is a plan view illustrating a display substrate according to an example embodiment. FIG. 2 is a cross-sectional view taken along the line I-I' of FIG. 1.

Referring to FIGS. 1 and 2, a display substrate includes a base substrate 100, a gate line GL, a data line DL, a gate insulation layer 110, a thin film transistor, a passivation layer 120, an organic insulation layer 130 and a pixel electrode PE. The thin film transistor includes a gate electrode GE, an active pattern AP, a source electrode SE and a drain electrode DE.

The gate line GL extends along a first direction D1. The data line DL extends along a second direction D2 substantially perpendicular to the first direction D1, and crosses the gate line GL.

The gate line GL and the data line DL define a pixel area. Although only one pixel area is generally described in the figures, the display substrate according to the example embodiments generally includes a large number of pixel units respectively formed in respective pixel areas. The pixel areas are typically arrayed for example as a regular matrix structure having a plurality of rows and columns. The pixel areas typically have same basic and repeated structures (although some variations for example in color of color filter portion or size or shape of pixel-electrode may occur), so that only one pixel area will be described herein as an example. Although the pixel area has a rectangular shape in the figures, the pixel area may have various modifications in size and/or shape and/or number of field altering slits or other fine features included therein. For example the pixel areas may have a "V" or a "Z" shape.

The thin film transistor includes a gate electrode GE, a source electrode SE, a drain electrode DE and the active pattern AP. The gate electrode GE of the thin film transistor is formed by protruding from the gate line GL in a second direction D2. The gate electrode GE overlaps with the active pattern AP.

The gate electrode GE may have, for example, a single layer structure including copper (Cu), silver (Ag), chrome (Cr), molybdenum (Mo), aluminum (Al), titanium (Ti), manganese (Mn) and a mixture thereof. In addition, the gate electrode GE may have, for example a multiple layer structure having a plurality of layers including materials different from each other. For example, the gate electrode GE may include a lower layer including titanium, and an upper layer disposed on the lower layer and including copper.

The active pattern AP overlaps with the gate electrode GE. The source electrode SE and the drain electrode DE are spaced apart from each other, and contact the active pattern AP, respectively.

The active pattern AP overlaps with a gate metal pattern including the gate line GL and the gate electrode GE. In addition, the active pattern AP overlaps with a data metal pattern including the source electrode SE, the drain electrode DE and the data line DL.

In an embodiment, the source electrode SE and the drain electrode DE respectively have a multiple-layered structure. For example, each of the source electrode SE and the drain electrode DE includes a lower barrier layer LB, a metal layer ML disposed on the lower barrier layer LB, and an upper barrier layer UB disposed on the metal layer ML. The metal layer ML may include a metal such as, for example, copper. The lower barrier layer LB and the upper barrier layer UB may include, for example, a conductive oxide. The barrier layers protect the metal layer ML and the active pattern AP including an oxide semiconductor. In another embodiment, the upper barrier layer UB may be omitted. For example, the lower barrier layer LB may comprise at least one selected from the group consisting of indium zinc oxide (IZO), indium tin oxide (ITO), gallium zinc oxide (GZO) and zinc aluminum oxide (ZAO). In addition, the upper barrier layer UB may, for example, comprise at least one selected from the group consisting of indium zinc oxide (IZO), indium tin oxide (ITO), gallium zinc oxide (GZO) and zinc aluminum oxide (ZAO).

The data line DL is electrically connected to the source electrode SE. For example, the source electrode SE may protrude from the data line DL in the first direction D1. The data line DL, the source electrode SE and the drain electrode DE may be disposed in a same layer. Thus, a source metal pattern formed from a same layer may include the source electrode SE, the drain electrode DE and the data line DL.

The gate insulation layer 110 covers the gate electrode GE, and the active pattern AP is disposed on the gate insulation layer 110. The gate insulation layer 110 may include an inorganic insulation material. For example, the gate insulation layer 110 may include silicon oxide (SiOx) or silicon nitride (SiNx). For example, the gate insulation layer 110 may include silicon oxide (SiOx) and may have thickness of 500 Å. In addition, the gate insulation layer 110 may have a multiple layer structure having a plurality of layers including materials different from each other.

The passivation layer 120 may be formed to cover the source electrode SE and the drain electrode DE. The passivation layer 120 may include a contact hole CH partially exposing the drain electrode DE. The passivation layer 120 may be formed with a material including silicon oxide (SiOx) or silicon nitride (SiNx).

The organic insulation layer 130 is disposed on the passivation layer 120. The organic insulation layer 130 planarizes an upper surface of the display substrate so that problems due to the step such as disconnection of a signal line may be prevented. The organic insulation layer 130 may be an insulation layer including an organic material.

The pixel electrode PE is disposed on the organic insulation layer 130, and is connected to the drain electrode DE through the contact hole CH formed through the passivation layer 120 and the organic insulation layer 130. The pixel electrode PE may include a transparent conductive material, such as indium tin oxide (ITO), indium zinc oxide (IZO) and etc. In addition, the pixel electrode PE may include, for example, titanium (Ti) and/or molybdenum titanium (MoTi).

The active pattern AP includes an oxide semiconductor. For example, the oxide semiconductor may include zinc oxide (ZnO), zinc tin oxide (ZTO), indium zinc oxide (IZO), indium oxide (MO), titanium oxide (TiO), indium gallium zinc oxide (IGZO), indium zinc tin oxide (IZTO) or the like. These may be used each alone or in a combination thereof. Usefully, the oxide semiconductor may include IGZO.

The active pattern AP covers a lower surface of the data metal pattern. Usefully, the active pattern AP covers an entire portion of the lower surface of the data metal pattern. Particularly, the active pattern AP covers lower surfaces of the source electrode SE and the drain electrode DE. Furthermore, the active pattern AP further covers a lower surface of the data line DL.

The active pattern AP overlaps with the gate electrode GE. Particularly, the active pattern AP is formed on the gate electrode GE to overlap with the gate electrode GE. In addition, the active pattern AP is formed on the gate line GL to overlap with the gate line GL.

FIGS. 3 to 17 are cross-sectional views and plan views illustrating an example embodiment of a method of manufacturing the display substrate of FIG. 2.

Figure 3:
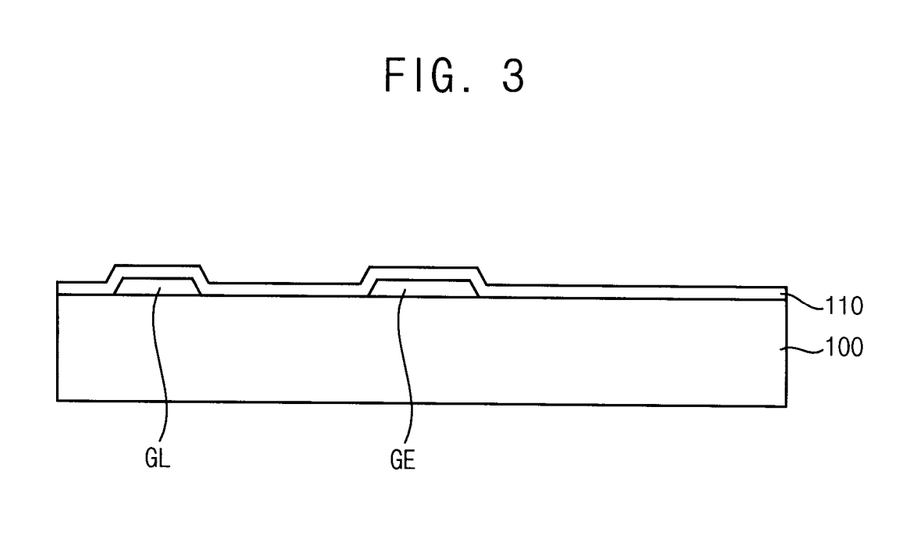
FIGS. 3 to 17 are cross-sectional views and plan views illustrating an example embodiment of a method of manufacturing the display substrate of FIG. 2.

Referring to FIG. 3, a gate line GL and a gate electrode GE are formed on a base substrate 100. For example, a gate metal layer is formed on the base substrate 100, and patterned to form the gate line GL and the gate electrode GE.

Examples of the base substrate 100 may include a glass substrate, a quartz substrate, a silicon substrate, a plastic substrate and the like.

The gate metal layer may have, for example, a single layer structure including copper (Cu), silver (Ag), chrome (Cr), molybdenum (Mo), aluminum (Al), titanium (Ti), manganese (Mn) and a mixture thereof. In addition, the gate metal layer may have a multiple layer structure having a plurality of layers including materials different from each other. For example, the gate metal layer may include a lower layer including titanium, and an upper layer disposed on the lower layer and including copper.

In another embodiment, the gate metal layer may include a metal layer and a conductive oxide layer disposed on and/or under the metal layer. For example, the gate metal layer may include a copper layer and a conductive oxide layer disposed on and/or under the copper layer. Examples of a material that may be used for the conductive oxide layer may include indium zinc oxide (IZO), indium tin oxide (ITO), gallium zinc oxide (GZO), and zinc aluminum oxide (ZAO).

Thereafter, a gate insulation layer 110 is formed to cover the gate line GL and the gate electrode GE. The gate insulation layer 110 may include an inorganic insulation material. For example, the gate insulation layer 110 may include silicon oxide (SiOx) or silicon nitride (SiNx). For example, the gate insulation layer 110 may include silicon oxide (SiOx) and may have thickness of 500 Å. In addition, the gate insulation layer 110 may have a multiple layer structure having a plurality of layers including materials different from each other.

Figure 4:
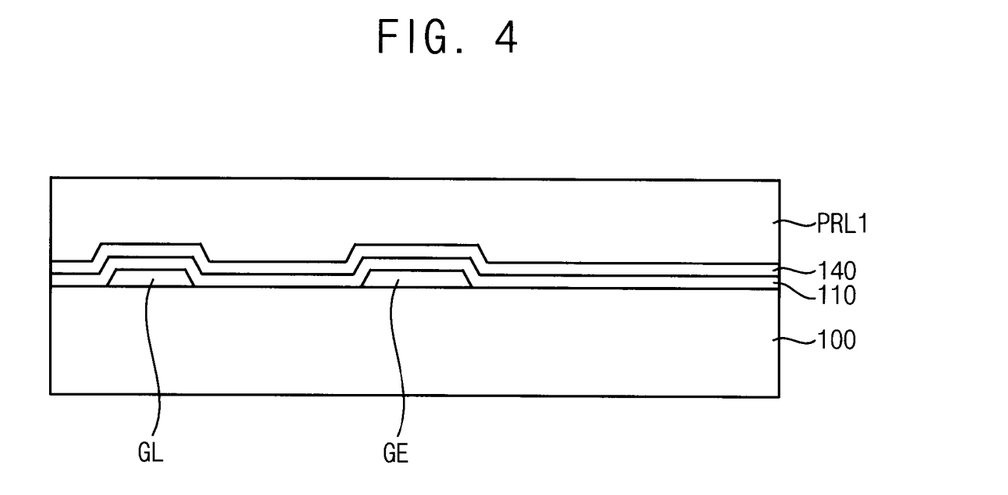

Referring to FIG. 4, an oxide semiconductor layer 140 and a first photoresist layer PRL1 are formed on the gate insulation layer 110.

Examples of a material that may be used for the oxide semiconductor layer 140 may include zinc oxide (ZnO), zinc tin oxide (ZTO), indium zinc oxide (IZO), indium oxide (InO), titanium oxide (TiO), indium gallium zinc oxide (IGZO), indium zinc tin oxide (IZTO) or the like. In an embodiment, the oxide semiconductor layer 140 includes IGZO.

The oxide semiconductor layer 140 may be formed through conventional methods for forming an oxide semiconductor layer, and may be usefully formed through a physical vapor deposition such as a vacuum deposition process or a sputtering process.

For example, in order to form the oxide semiconductor layer 140, a source having a similar composition to the oxide semiconductor layer 140 may be used as a target of a sputtering process.

Usefully, after the oxide semiconductor layer 140 is formed, an annealing process for heating the oxide semiconductor layer 140 may be performed. For example, the annealing process may be performed at a temperature of about 100° C. to about 700° C., and usefully at a temperature of about 300° C. to about 400° C. Electrical characteristics of the oxide semiconductor layer 140 may be improved through the annealing process.

The first photoresist layer PRL1 is formed on the oxide semiconductor layer 140. The first photoresist layer PRL1 may comprise a negative type photoresist composition or a positive type photoresist composition.

Figure 5:
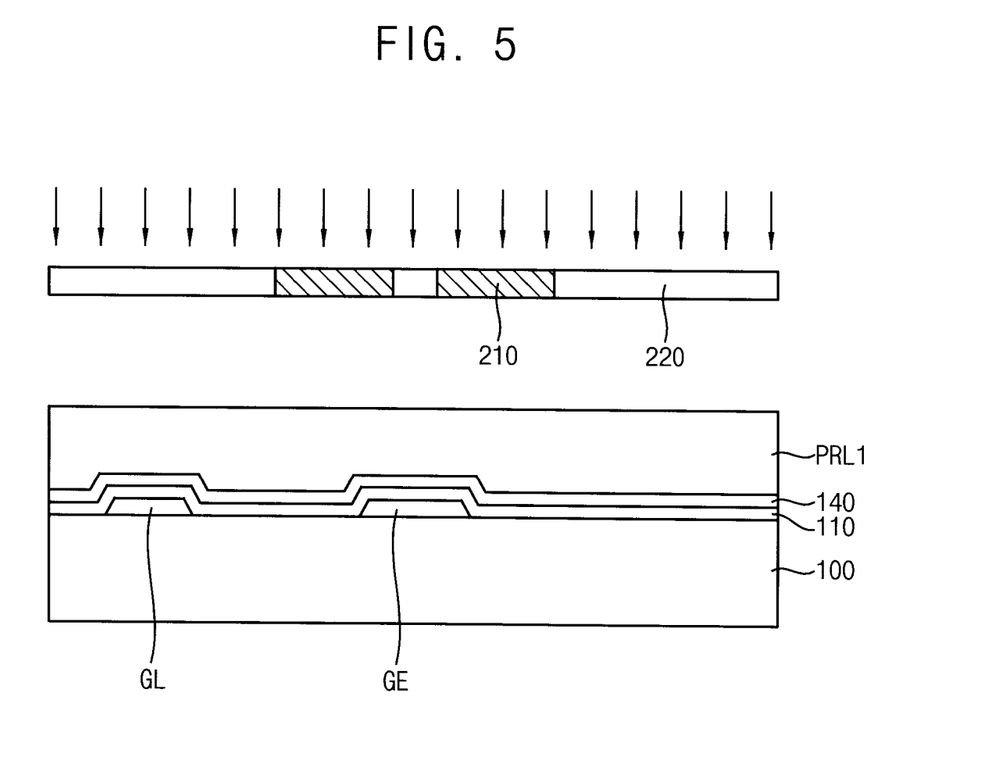

Referring to FIG. 5, the first photoresist layer PRL1 comprises a photoresist composition. The photoresist composition may be a negative type photoresist composition. For example, the photoresist composition may comprise an ethylenically unsaturated compound, a photopolymerization initiator, a thermosetting compound and an organic solvent.

When the first photoresist layer PRL1 comprises a negative type photoresist composition, an unexposed portion of the first photoresist layer PRL1 is removed by a developer. The first photoresist layer PRL1 is exposed by using a mask 200 to form a first photoresist pattern.

The mask 200 includes a light blocking portion 210 and a light transmission portion 220. A portion of the first photoresist layer PRL1 unexposed by the light blocking portion 210 may be removed. A portion of the first photoresist layer PRL1 exposed by the light transmission portion 220 may remain. Thereafter, a data metal pattern may be formed on a region in which the first photoresist layer PRL1 is removed.

Figure 6:
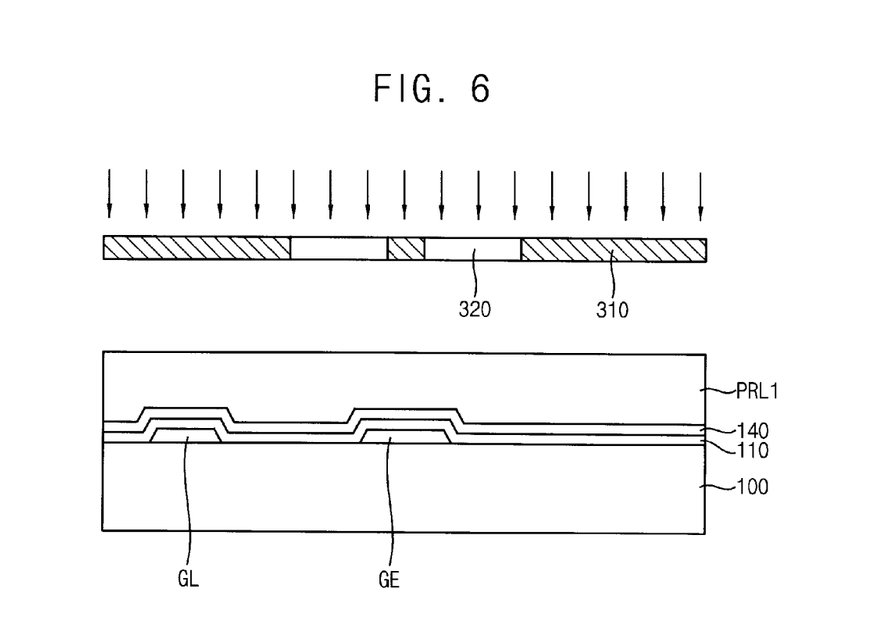

Alternatively, referring to FIG. 6, the first photoresist layer PRL1 comprises a photoresist composition. The photoresist composition may be a positive type photoresist composition.

When the first photoresist layer PRL1 comprises a positive type photoresist composition, an exposed portion of the first photoresist layer PRL1 is removed by a developer. The first photoresist layer PRL1 is exposed by using a mask 300 to form a first photoresist pattern PR1.

The mask 300 includes a light blocking portion 310 and a light transmission portion 320. A portion of the first photoresist layer PRL1 unexposed by the light blocking portion 310 may remain. A portion of the first photoresist layer PRL1 exposed by the light transmission portion 320 may be removed. Thereafter, a data metal pattern may be formed on a region in which the first photoresist layer PRL1 is removed.

Figure 7:
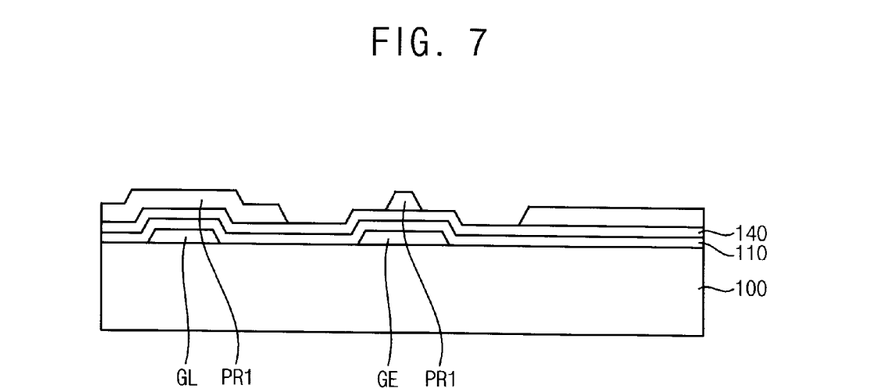
Figure 8:
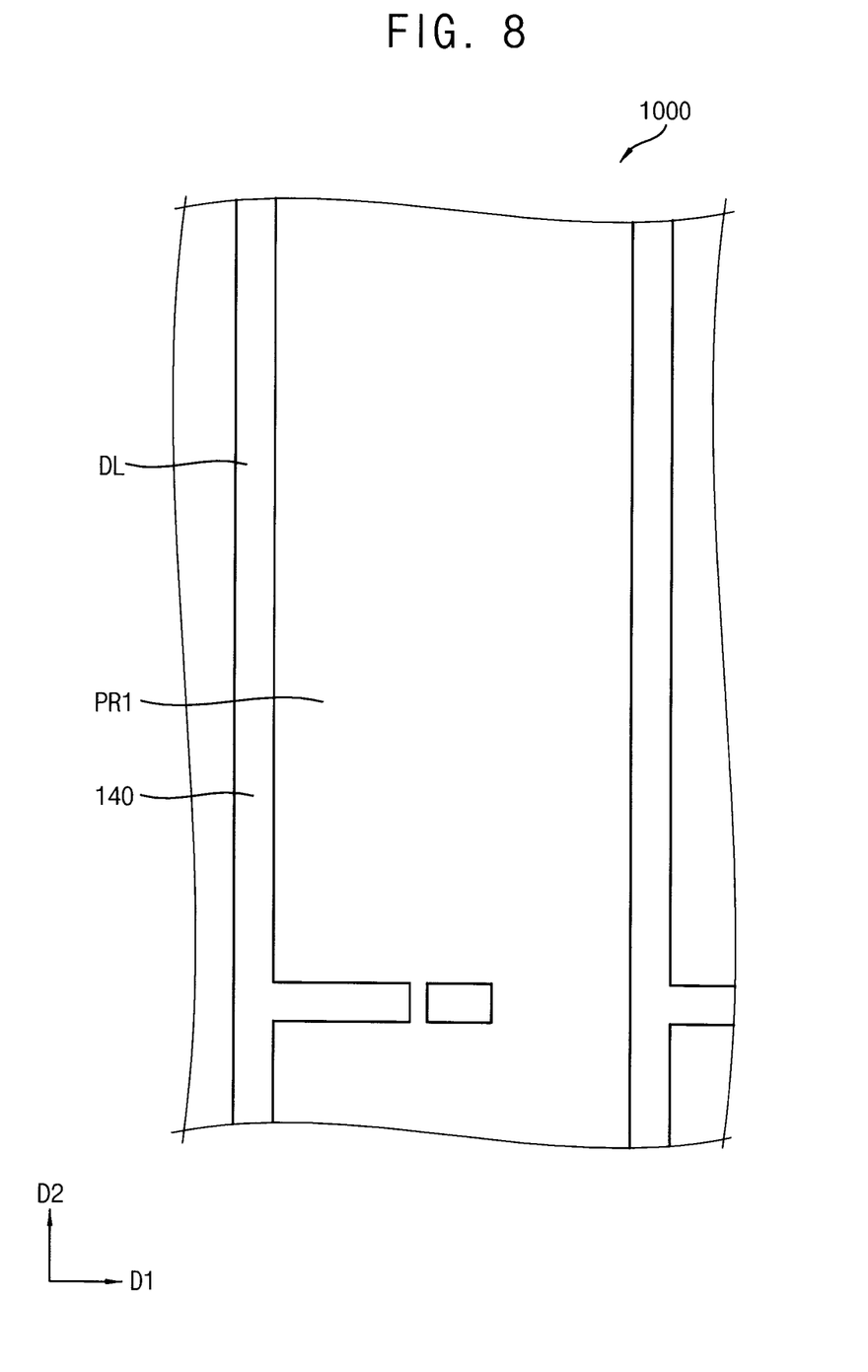

Referring to FIGS. 7 and 8, the first photoresist layer PRL1 is exposed to form a first photoresist pattern PR1.

When the first photoresist layer PRL1 comprises a negative type photoresist composition, an unexposed portion of the first photoresist layer PRL1 is removed by a developer. Alternatively, when the first photoresist layer PRL1 comprises a positive type photoresist composition, an exposed portion of the first photoresist layer PRL1 is removed by a developer. For example, a portion of the first photoresist layer PRL1 in a region in which a data metal pattern is to be formed may be removed. Thus, the first photoresist pattern PR1 may expose a portion of the oxide semiconductor layer 140.

Thereafter, the data metal pattern including the source electrode SE, a drain electrode DE and the data line DL may be formed on the partially exposed oxide semiconductor layer 140.

Figure 9:
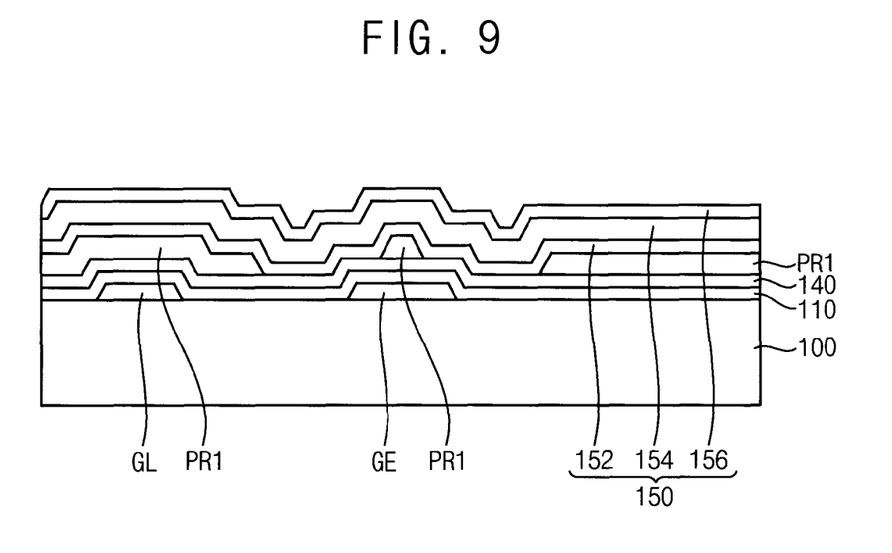

Referring to FIG. 9, a data metal layer 150 is formed on the base substrate 100 on which the first photoresist pattern PR1 is formed. The data metal layer 150 covers the oxide semiconductor layer 140 and the first photoresist pattern PR1. Thereafter, the data metal layer 150 covering the first photoresist pattern PR1 is removed.

The data metal layer 150 includes a lower conductive oxide layer 152, a metal layer 154 and an upper conductive oxide layer 156, which are sequentially deposited on the oxide semiconductor layer 140.

The lower conductive oxide layer 152 and the upper conductive oxide layer 156 include a conductive oxide. For example, the lower conductive oxide layer 152 may include at least one of the selected from the group consisting of indium zinc oxide (IZO), indium tin oxide (ITO), gallium zinc oxide (GZO) and zinc aluminum oxide (ZAO). In addition, the upper conductive oxide layer 156 may include at least one of the selected from the group consisting of indium zinc oxide (IZO), indium tin oxide (ITO), gallium zinc oxide (GZO) and zinc aluminum oxide (ZAO).

In an embodiment, the metal layer 154 may include, for example, copper.

Figure 10:
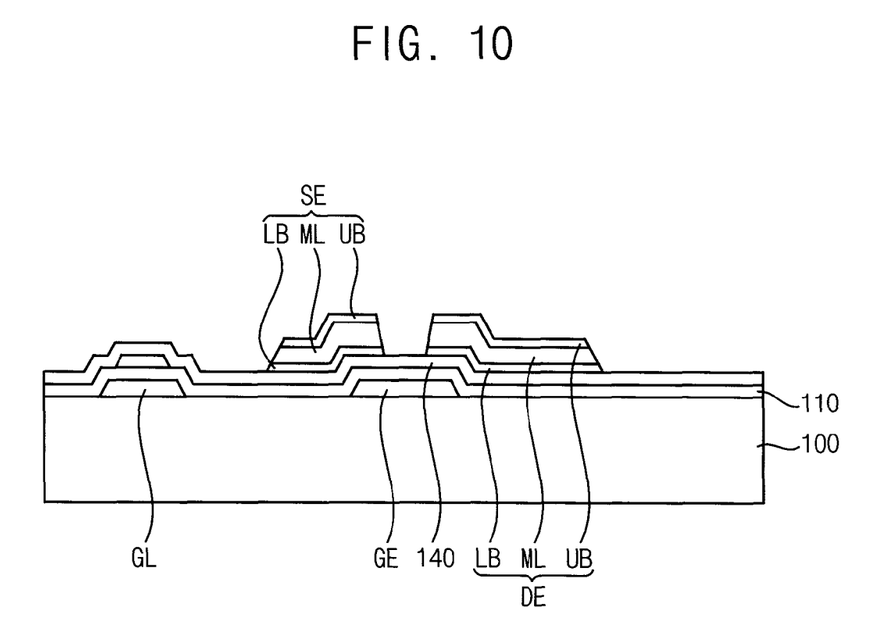

Referring to FIG. 10, the first photoresist pattern PR1 is removed by using a developer. The data metal layer 150 covering the first photoresist pattern PR1 is removed by a lift-off process. Thus, the data metal pattern is formed on the oxide semiconductor layer 140.

The data metal pattern formed on the oxide semiconductor layer 140 may be a source electrode SE and a drain electrode DE.

The source electrode SE and the drain electrode DE respectively have a multiple-layered structure. For example, each of the source electrode SE and the drain electrode DE includes a lower barrier layer LB, a metal layer ML disposed on the lower barrier layer LB, and an upper barrier layer UB disposed on the metal layer ML. The metal layer ML may include a metal such as copper. The lower barrier layer LB and the upper barrier layer UB may include a conductive oxide. The barrier layers protect the metal layer ML and the active pattern AP including an oxide semiconductor. In another embodiment, the upper barrier layer UB may be omitted. For example, the lower barrier layer LB may comprise at least one selected from the group consisting of indium zinc oxide (IZO), indium tin oxide (ITO), gallium zinc oxide (GZO) and zinc aluminum oxide (ZAO). In addition, the upper barrier layer UB may comprise at least one selected from the group consisting of indium zinc oxide (IZO), indium tin oxide (ITO), gallium zinc oxide (GZO) and zinc aluminum oxide (ZAO).

Figure 11:
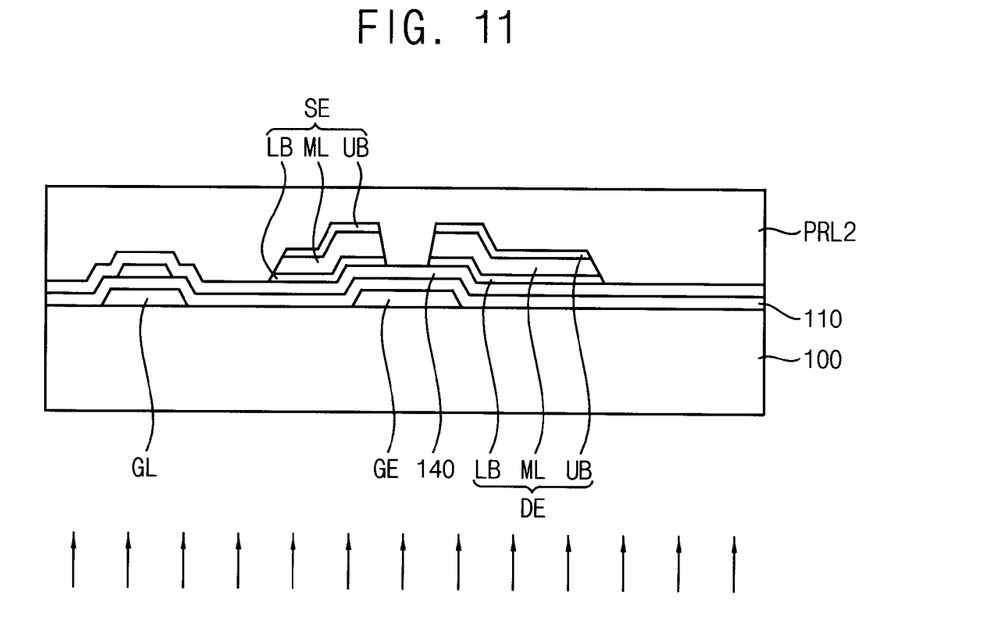

Referring to FIG. 11, a second photoresist layer PRL2 is formed on the base substrate 100 on which the data metal pattern is formed. Thereafter, the second photoresist layer PRL2 is back exposed, i.e. via the back side of substrate 100, to form a second photoresist pattern PR2.

The second photoresist layer PRL2 comprises a photoresist composition. The photoresist composition may be a positive type photoresist composition. When the second photoresist layer PRL2 comprises a positive type photoresist composition, an exposed portion of the second photoresist layer PRL2 is removed by a developer. An unexposed portion of the second photoresist layer PRL2 may remain on the active pattern AP, the source electrode SE and the drain electrode DE. An exposed portion of the second photoresist layer PRL2 may be removed.

When the second photoresist layer PRL2 comprises a positive type photoresist composition, an exposed portion of the second photoresist layer PRL2 is removed by a developer. The second photoresist layer PRL2 is exposed by using a gate pattern and a data pattern as a mask to form a second photoresist pattern PR2.

The second photoresist layer PRL2 is exposed by back exposure. Thus, light is irradiated from a lower surface of the base substrate 100 to an upper surface of the base substrate 100. Examples of the base substrate 100 may include a glass substrate, a quartz substrate, a silicon substrate, a plastic substrate and the like. Thus, light is transmitted through the base substrate 100.

The gate metal pattern and the data metal pattern comprise a metal that is opaque, so that light is not transmitted through the gate metal pattern and the data metal pattern. Thus, a portion of the second photoresist layer PRL2 disposed on the gate metal pattern and the data metal pattern is not exposed. The second photoresist layer PRL2 comprises a positive type photoresist composition, so that an unexposed portion of the second photoresist layer PRL2 may be remained. For example, a portion of the second photoresist layer PRL2 disposed on the gate metal pattern and the data metal pattern remains.

Figure 12:
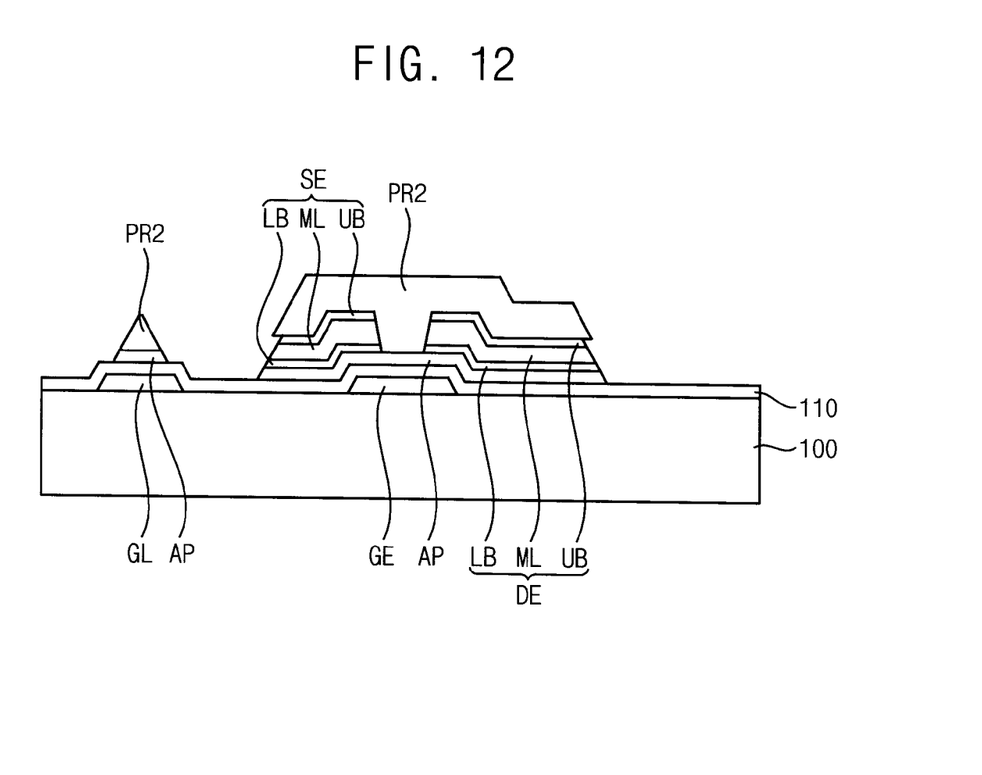

Referring to FIG. 12, a second photoresist pattern PR2 is formed on the base substrate 100 on which the data metal pattern is formed. For example, the second photoresist layer PRL2 is exposed using the gate metal pattern and the data metal pattern as a mask to form the second photoresist pattern PR2.

The oxide semiconductor layer 140 is etched to form an active pattern AP. The active pattern AP overlaps with the second photoresist pattern PR2. The oxide semiconductor layer 140 may be etched by a dry etching or a wet etching.

The second photoresist layer PRL2 is exposed by back exposure to form the second photoresist pattern PR2. The photoresist composition may be a positive type photoresist composition. When the second photoresist layer PRL2 comprises a positive type photoresist composition, an exposed portion of the second photoresist layer PRL2 is removed by a developer. An unexposed portion of the second photoresist layer PRL2 may remain on the active pattern AP, the source electrode SE and the drain electrode DE. An exposed portion of the second photoresist layer PRL2 may be removed.

The gate metal pattern may have, for example, a single layer structure including copper (Cu), silver (Ag), chrome (Cr), molybdenum (Mo), aluminum (Al), titanium (Ti), manganese (Mn) and a mixture thereof. In addition, the gate metal pattern may have a multiple layer structure having a plurality of layers including materials different from each other. For example, the gate metal pattern may include a lower layer including titanium, and an upper layer disposed on the lower layer and including copper. The data metal pattern may have, for example, a single layer structure including copper (Cu), silver (Ag), chrome (Cr), molybdenum (Mo), aluminum (Al), titanium (Ti), manganese (Mn) and a mixture thereof. In addition, the data metal pattern may have a multiple layer structure having a plurality of layers including materials different from each other. For example, the data metal pattern may include a lower layer including titanium, and an upper layer disposed on the lower layer and including copper. Thus, light is not transmitted through the gate metal pattern and the data metal pattern. Thus, a portion of the second photoresist layer PRL2 disposed on the gate metal pattern and the data metal pattern is not exposed. The second photoresist layer PRL2 comprises a positive type photoresist composition, so that an unexposed portion of the second photoresist layer PRL2 may remain. For example, a portion of the second photoresist layer PRL2 disposed on the gate metal pattern and the data metal pattern remains.

Figure 13:
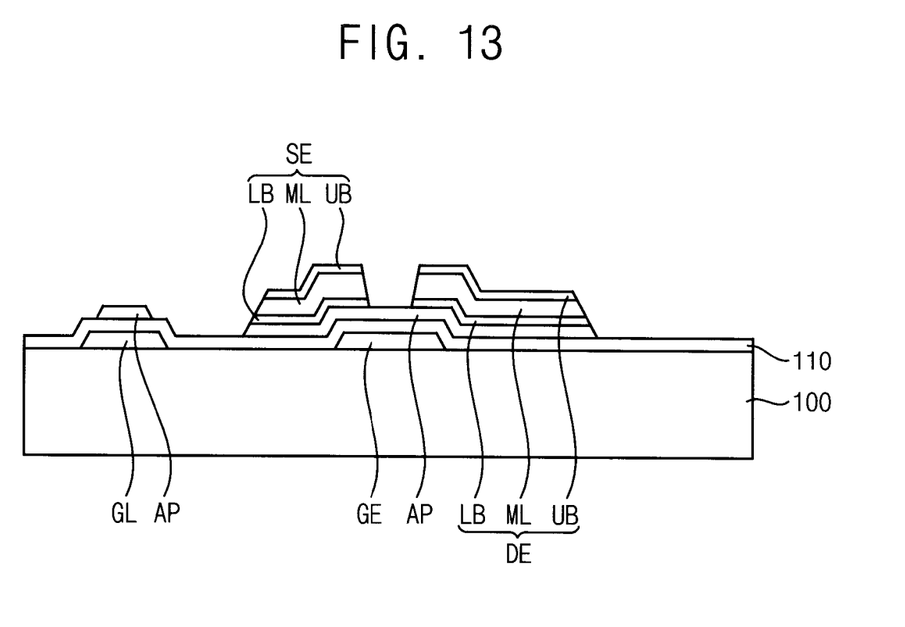
Figure 14:
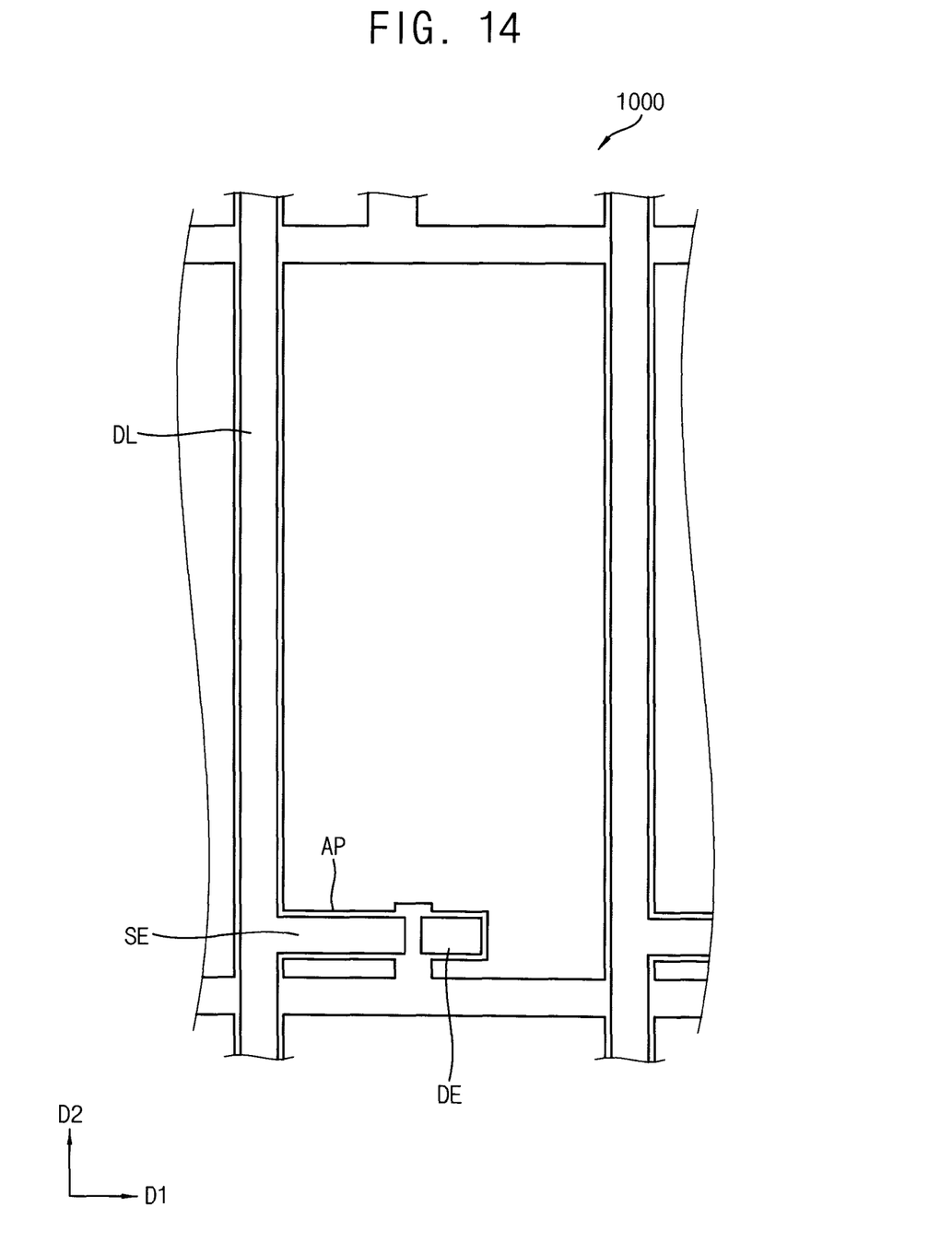
Figure 15:
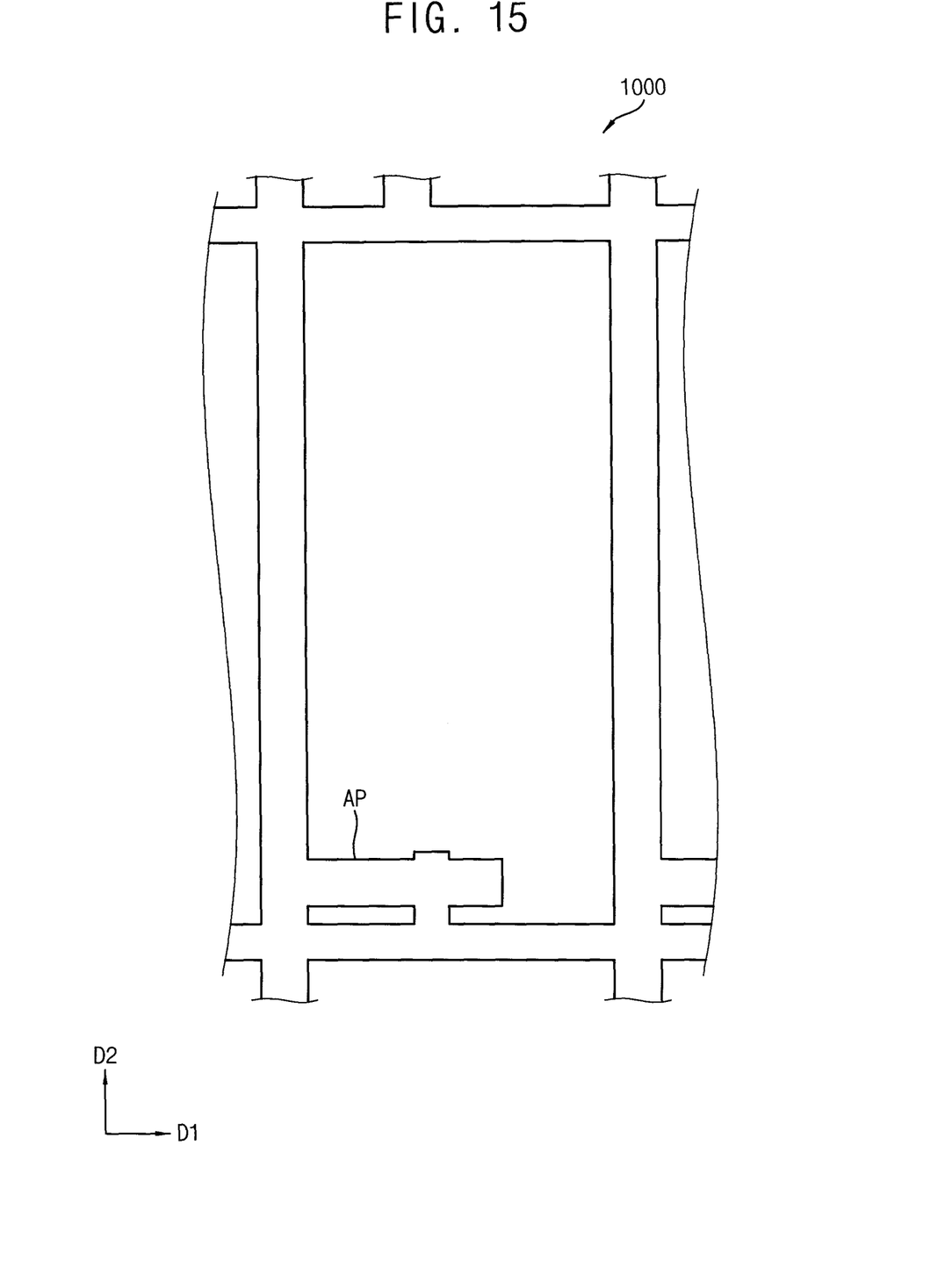

Referring to FIGS. 13 to 15, the second photoresist pattern PR2 is removed. Thus, the active pattern AP and the data metal pattern including a data line DL, a source electrode SE and a drain electrode DE are formed on the base substrate 100.

The active pattern AP may include an overlapping region in which the active pattern AP is overlapped with the source electrode SE and the drain electrode DE and an exposing region in which the active pattern AP is not overlapped with the source electrode SE and the drain electrode DE.

In the present example embodiment, the active pattern AP is not etched. Thus, a thickness of the overlapping region of the active pattern AP and a thickness of the exposing region of the active pattern AP may be same.

In addition, the active pattern AP is formed by back exposure. Thus, the active pattern AP may be formed on an unexposed region which overlaps with the gate metal pattern and the data metal pattern.

Figure 16:
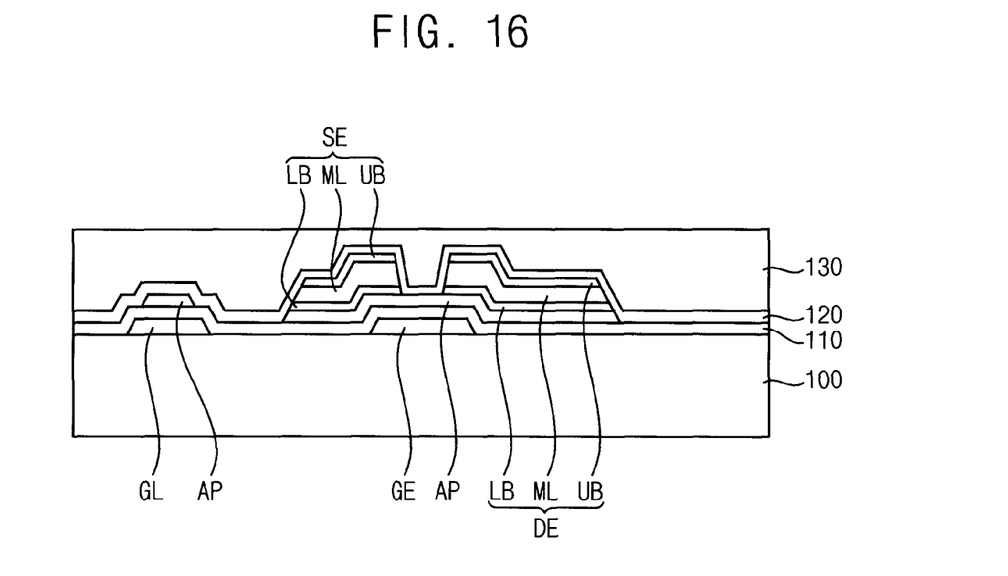

Referring to FIG. 16, a passivation layer 120 is formed so as to cover the thin film transistor, and an organic insulation layer 130.

The passivation layer 120 includes an inorganic insulation material. For example, the passivation layer 120 may include silicon oxide, silicon nitride or the like. Organic insulation layer 130 is formed on the passivation layer 120.

The organic insulation layer 130 includes an organic insulation material. The organic insulation layer 130 planarizes a surface of the substrate. A photoresist composition may be spin-coated to form the organic insulation layer 130. In another embodiment, a color filter may be formed on the passivation layer 120 instead of the organic insulation layer 130, or may be formed between the passivation layer 120 and the organic insulation layer 130.

Figure 17:
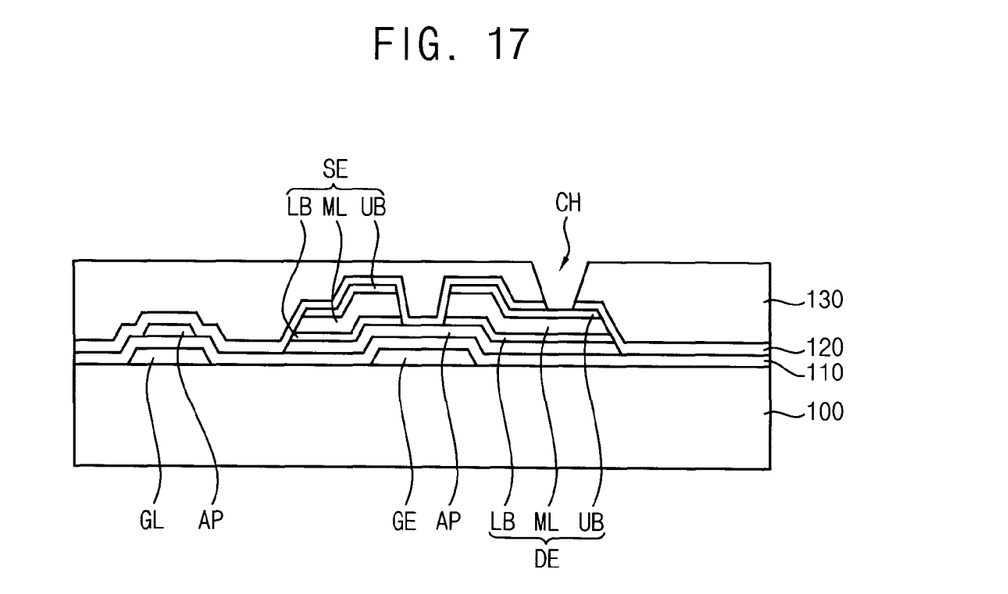

Referring to FIG. 17, a contact hole CH is formed through the organic insulation layer 130 and the passivation layer 120. The drain electrode DE may be exposed through the contact hole CH.

Thereafter, a transparent conductive layer is formed on the organic insulation layer 130. Examples of a material that may be used for the transparent conductive layer may include ITO, IZO and the like. A portion of the transparent conductive layer contacts the drain electrode DE through the contact hole.

Thereafter, the transparent conductive layer is patterned to form a pixel electrode PE illustrated in FIG. 2. An alignment layer (not illustrated) may be formed on the pixel electrode PE to align liquid crystal molecules. In another embodiment, the display substrate may further include a common electrode forming an electric field with the pixel electrode PE and being disposed on or under the pixel electrode PE.

In an embodiment, the thin film transistor has a bottom-gate structure in which a gate electrode is disposed under an active pattern. In another embodiment, the thin film transistor may have a top-gate structure in which a gate electrode is disposed on an active pattern.

According to one or more example embodiment, an active pattern is not etched. Thus, a thickness of an overlapping region of the active pattern and a thickness of an exposed region of the active pattern AP may be same.

In addition, a thickness of the active pattern is uniformly formed, so that a characteristic of a thin film transistor may be improved. Thus, a quality of a display apparatus may be improved.

The foregoing is illustrative and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the invention. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of disclosure, including the appended claims, with equivalents of the claims to be included therein.

What is claimed is:

1. A method of manufacturing a display substrate, the method comprising:
    forming sequentially a gate metal pattern, a gate insulation layer and an oxide semiconductor layer on a base substrate;
    forming a first photoresist layer on the oxide semiconductor layer;
    exposing the first photoresist layer to form a first photoresist pattern in which the first photoresist layer covers the base substrate except for a source electrode region and a drain electrode region;
    forming a source electrode and a drain electrode in the source electrode region and the drain electrode region respectively;
    forming a second photoresist layer on the source electrode and the drain electrode;
    exposing the second photoresist layer using back exposure through the base substrate to form a second photoresist pattern; and
    etching the oxide semiconductor layer using the second photoresist pattern as a etch stop layer to form an active pattern.

2. The method of claim 1, wherein the forming a source electrode and a drain electrode comprises:
    depositing a data metal layer on the first photoresist pattern; and
    removing the first photoresist pattern.

3. The method of claim 2, wherein the first photoresist layer comprises a negative type photoresist composition.

4. The method of claim 2, wherein the first photoresist layer comprises a positive type photoresist composition.

5. The method of claim 2, wherein removing the first photoresist pattern comprises removing the data metal layer formed on the first photoresist pattern.

6. The method of claim 2, wherein the data metal layer is deposited by a sputtering process.

7. The method of claim 1, wherein the oxide semiconductor layer comprises at least one selected from the group consisting of zinc oxide, zinc tin oxide, indium zinc oxide, indium oxide, titanium oxide, indium gallium zinc oxide and indium zinc tin oxide.

8. The method of claim 1, wherein the source electrode and the drain electrode comprise:
    a metal layer; and
    a lower barrier layer disposed under the metal layer and contacting the active pattern.

9. The method of claim 8, wherein the metal layer comprises copper.

10. The method of claim 8, wherein the lower barrier layer comprises at least one selected from the group consisting of indium zinc oxide, indium tin oxide, gallium zinc oxide and zinc aluminum oxide.

11. The method of claim 8, wherein the data metal pattern further comprises an upper barrier layer disposed on the metal layer.

12. The method of claim 11, wherein the upper barrier layer comprises at least one selected from the group consisting of indium zinc oxide, indium tin oxide, gallium zinc oxide and zinc aluminum oxide.

* * * * *